(12) United States Patent
Miller (10) Patent No.: US 6,242,899 B1
(45) Date of Patent: Jun. 5, 2001

(54) WAVEFORM TRANSLATOR FOR DC TO 75 GHZ OSCILLOGRAPHY

(75) Inventor: Robert Miller, Old Bethpage, NY (US)

(73) Assignee: Lecroy Corporation, Chestnut Ridge, NY (US)

( * ) Notice: Subject to any disclaimer, the term of this patent is extended or adjusted under 35 U.S.C. 154(b) by 0 days.

(21) Appl. No.: 09/096,993

(22) Filed: Jun. 13, 1998

(51) Int. Cl.[7] ................................................. G01R 23/02
(52) U.S. Cl. ............................................................ 324/76.24
(58) Field of Search ........................... 324/76.24, 76.23, 324/76.42, 76.58, 76.15, 76.38; 702/119; 371/22.1, 148

(56) References Cited

U.S. PATENT DOCUMENTS

| | | | |
|---|---|---|---|
| 3,010,071 | 11/1961 | Carlson | 328/186 |
| 3,832,568 | 8/1974 | Wang | 307/106 |
| 4,065,793 | * 12/1977 | Maxwell, Jr. | 360/6 |
| 4,427,938 | 1/1984 | Prevot | 324/78 |
| 4,611,164 | * 9/1986 | Mitsuyoshi et al. | 324/76.24 |
| 5,162,723 | * 11/1992 | Marzalek et al. | 324/77 |
| 5,424,664 | * 6/1995 | Phillips | 327/106 |
| 5,589,763 | 12/1996 | Burns | 324/76.15 |
| 5,598,440 | * 1/1997 | Domangala | 375/329 |
| 5,631,553 | 5/1997 | Bose | 324/76.24 |

OTHER PUBLICATIONS

Frye, G. and Nahman, N.S., "Random Sampling Oscillography," IEEE Transactions on Instrumentation and Measurements, Mar. 1964, pp. 8–13.

Gaddy, O.L., "A Simple Methode of Measuring Fractional Millimicrosecond Pulse Characteristics," IEEE Transactions on Instrumentation and Measurements, Dec. 1960, pp. 326–333.

* cited by examiner

Primary Examiner—Safet Metjahic
Assistant Examiner—T. R. Sundaram
(74) Attorney, Agent, or Firm—Frommer Lawrence & Haug LLP; William S. Frommer; Bruno Polito (57) ABSTRACT

A waveform translator in which the frequency spectrum of a repetitive non band limited input signal is translated to an equivalent frequency spectrum which is harmonically related to a fixed reference frequency. In the waveform translator a synthesized source generator and a synthesized receive generator are made coherent. The source generator drives a DUT, and the receive generator coupled to a sampler, samples the DUT to produce a non band limited difference signal harmonically related to the fixed reference frequency. The difference signal is digitized in an analog to digital converter which is clocked at the reference frequency and produces a predetermined integer number of data points per cycle corresponding to the input signal. A computer is coupled to the waveform translator for DC to 75 GHz oscillography.

14 Claims, 8 Drawing Sheets

WAVEFORM TRANSLATOR FOR DC TO 75 GHZ OSCILLOGRAPHY

BACKGROUND—FIELD OF INVENTION

This invention relates to test and measurement equipment. Specifically the invention is directed toward a waveform translator, i.e., translating the frequency spectrum of a repetitive non band limited input signal, to an equivalent frequency spectrum which is harmonically related to a fixed reference frequency. An analog to digital converter is clocked at the reference frequency to produce a digitized waveform with a predetermined integer number of data points per cycle corresponding to the input signal.

BACKGROUND—DESCRIPTION OF PRIOR ART

There was a long felt and unsolved need to display time domain waveforms from DC through the millimeter wave range. Although some attempts have been made in this direction with sampling oscilloscopes, none have been successful. The reason for this is that recent attempts have tried to leverage off existing technology, and new technology is required for the vertical sampler section and the horizontal timing section.

In a sequential sampling oscilloscope the input waveform is sampled at a selected point which is moved incrementally along the input waveform at each successive recurrence of the input waveform. The horizontal sweep circuits should provide the horizontal displacement of successive samples along the displayed waveform as a function of time.

U.S. Pat. No. 3,010,071 issued Nov. 21, 1961 to A. R. Carlson relates to sweep circuits in sequential sampling oscilloscopes. An input trigger circuit is required which is capable of precisely detecting a predetermined trigger level on the input waveform and which initiates the start of a fast ramp voltage generator. A voltage comparator circuit is provided which is capable of precisely detecting coincidence between a generated staircase voltage and the fast ramp voltage and which provides a sampling trigger pulse at the precise instant of coincidence. The circuit increments the staircase voltage on each recurrence of the input waveform. The time resolution and accuracy of this technique is extremely limited by the speed and linearity of the fast ramp voltage circuit, the dynamic accuracy of the voltage comparator and the accuracy of the staircase voltage generator. In addition, this technique is further limited by the necessity to trigger the fast ramp voltage generator in synchronization with the input waveform.

A random sampling oscilloscope is described, e.g., in Frye, G. and Nahman, N. S., "Random Sampling Oscillography," IEEE Transactions on Instrumentation and Measurement, March 1964, pp. 8–13. In the random sampling oscilloscope, samples of the signal waveform amplitude are extracted at random points in time with respect to the start of the signal waveform. The time position, with respect to the start of the signal waveform, of a given amplitude sample is determined by measuring the elapsed time occurring between the start of a given cycle of the signal waveform and the random collision between the signal and the sampling pulse. An input trigger circuit is required which is capable of precisely detecting a predetermined trigger level on the input waveform and which initiates the start of a horizontal time ramp generator at time t0. A free running periodic sampling pulse arrives at some time t0+t1, and a sample is immediately taken of the signal amplitude at the time t0+t1; this information is stored in a vertical memory. The sampling pulse is also passed through a delay td to the horizontal time ramp generator. The arrival of the delayed sampling pulse stops the excursion of the horizontal time ramp at t0+t1+td. Then the maximum excursion of the horizontal time ramp is stored in a horizontal memory. Therefore, two pieces of information are now stored in memory, a) the instantaneous amplitude of the signal at the moment the sample pulse arrives; and b) the time position t0+t1 plus a constant delay time td. After the memories are read, the memories are reset, and the system is ready for another initiating trigger pulse. The time resolution and accuracy of this technique is extremely limited by the speed and linearity of the horizontal time ramp, and the accuracy of starting and stopping the horizontal time ramp generator. In addition, this technique is further limited by the necessity to trigger the horizontal time ramp generator in synchronization with the input waveform.

U.S. Pat. No. 5,162,723 issued Nov. 10, 1992 to Michael S. Marzalek, Richard C. Keiter, John A. Wendler, Stephen R. Peterson, Ronald J. Hogan describes a sampling signal analyzer. The sampling signal analyzer comprises a means for synthesizing a sampler drive signal. Sample timing is based on the intermediate frequency signal produced by the sampler. The intermediate frequency can be an arbitrarily low frequency, which allows digitizing and digital signal processing. However, the intermediate frequency requires low pass filtering to reject intermodulation products generated in the sampling process. The low pass provides a means for bandwidth limiting the intermediate frequency signal before analog to digital conversion takes place. In accordance with the disclosure in this patent, the frequency of the input waveform is initially ascertained, an appropriate sampling frequency is then determined, data needed to reconstruct the input waveform is acquired, and the input signal wave shape is reconstructed for display. Although this invention has an advantage over prior art in that it is not triggered directly in response to the level of the input signal to be measured, the disclosed architecture has many disadvantages. The phase noise of the sampler drive signal source is a significant limiting factor when measuring signals to 40 Ghz. The sampler drive signal frequency resolution is in the order of 0.001 Hz and is not sufficient for coherent sampling of pseudo random binary sequences. Pseudo random patterns do not appear in the same position on the display screen from sweep to sweep unless a recovered clock is used as a trigger source. The frequency response of this instrument is limited to 20 GHz without software corrections and to 40 GHz with software corrections. However, software corrections cannot always be applied e.g., when measuring eye diagrams. In the disclosed invention the clock frequency of the vertical channel analog to digital converter circuit is the same as the sampler drive frequency. The sampler drive frequency is from 10 MHz to 20 MHz, a very low frequency for accurate microwave and millimeter wave sampling above 20 GHz, and unfortunately too high a frequency to clock a high resolution analog to digital converter. For this reason, this architecture suffers in frequency response, and in vertical dynamic range of only 10 bits. The step recovery diode pulse generator is physically removed and shared between two sampler circuits. Because of the interconnect and loading, the pulse generators harmonic content can degrade. The sampler is of a known type comprised of two diodes and a balun. The parasitic capacitance of two diodes introduces substantial loading on the input port. Furthermore, the frequency response of the balun can effect the pulse generator's harmonic content. The foregoing disadvantages contribute to limiting the disclosed inventions frequency bandwidth to 20 GHz and the dynamic range to 10 bits.

U.S. Pat. No. 5,631,553 issued May 20, 1997 to Tapan K. Bose and Raymond Courteau describes an RF vector analyzer based on synchronous sampling. In this apparatus the sampling strobe synthesizer is physically removed and shared between all of the sampling gates. Because of the interconnect and loading, the sampling strobe synthesizer's harmonic content can degrade. The sampling gate is in the form of a four diode bridge and the sampling strobe synthesizer is introduced to the bridge through a differential transistor pair and an isolation transformer. The use of a four diode bridge, a differential transistor pair, and an isolation transformer severely restricts the bandwidth of this sampler. The sampling strobe synthesizer requires a time interpolator comprising a ramp generator, a comparator, and a digital to analog converter. The time resolution and accuracy of this technique is extremely limited by the linearity of the ramp voltage generator, the dynamic accuracy of the voltage comparator, and the resolution of the digital to analog converter. In accordance with the disclosure in this patent, the total time jitter of the system is about 30 psec rms. In addition, the sampling frequency is limited by the speed of the discrete time signal processor and results in a maximum sampling frequency of 25 KHz, a very low frequency for accurate microwave and millimeter wave sampling above 2 GHz. Furthermore, increasing the sampling frequency would preclude the use of a high resolution analog to digital converter. The foregoing disadvantages result in, limiting the disclosed inventions upper frequency to 2 GHz, timing jitter of 30 psec rms., and a vertical dynamic range of 9 bits.

U.S. Pat. No. 5,589,763 issued Dec. 31, 1996 to Mark A. Burns describes a coherent under sampling digitizer. The apparatus employs two signal generators set at a precise frequency ratio to generate evenly spaced sample pulses which produce a coherent data sample set. The sample times accurately wrap from the last sample of the input waveform to the first sample of an identical input waveform in a coherent manner. Consequently, non windowed FFT analysis can be used. This apparatus measures the input waveform with a strobed comparator having a signal bandwidth approaching 1 GHz. The inability to measure signals beyond 1 GHz is a severe disadvantage of this prior art.

U.S. Pat. No. 3,229,212 issued Jan. 11, 1966 to J. V. Rogers describes a direct sampling apparatus. The sampler gate is in the form of a four diode bridge mounted in a test probe remote from the oscilloscope. The sampler drive signal is introduced to the bridge through an isolation transformer. The use of a four diode bridge and an isolation transformer severely restricts the bandwidth of this sampler. In addition, the inherent low frequency performance of the impulse generator, being remote from the sampling bridge, will limit the upper frequency range of the sampling apparatus.

U.S. Pat. No. 4,427,938 issued Jan. 24, 1984 to Julien Prevot describes a very wideband sampler. The invention is distinguished by the fact that one and the same waveguide section is employed for the transmission of pulses from the local source, filtering by removal of low frequency components from the spectrum, and beating with the signal whose frequency is to be measured in a known circuit constituted by two diodes mounted in series within the waveguide section. The impedance match at the input port of this apparatus is problematic due to the coaxial to waveguide transition into the guide and by the parasitic loading of two diodes in the sampler circuit. In addition, waveguide dispersion of the sampler drive pulse can lead to taking multiple samples of the input waveform per sampler drive period.

In the interest of improving vertical system bandwidth in sampling oscilloscopes a technique is described in Gaddy, O. L., "A Simple Method of Measuring Fractional Millimicrosecond Pulse Characteristics," IEEE Transactions on Instrumentation and Measurement, December 1960, pp.326–333, which uses a coincidence circuit in a coaxial tee structure. Here, all components can be made extremely broadband and the frequency response is limited by the frequency response of the coaxial transmission line in association with the switching characteristics of a diode. However, the coincidence detector as described does not have a DC return nor does it use an impulse to sample the input signal. As a result the coincidence detector is useful only for measuring pulses of a general trapezoidal shape.

U.S. Pat. No. 3,832,568 issued Aug. 27, 1974 to Chao C. Wang describes a circuit for generating a single high voltage subnanosecond pulse from a step recovery diode. In this apparatus a low repetition rate impulse is generated and passed through a filter which produces a damped sine wave. The damped sine wave is input to a biased step recovery diode circuit. The bias current combines with the damped sine wave so that only the first cycle of the damped sine wave can deplete the charge in the step recovery diode and only one high voltage subnanosecond pulse is produced. The disclosed circuit requires a substantial amount of power making it impractical to use in a sampling oscilloscope. In addition, the input repetition rate is limited to a fairly narrow range of low frequencies.

OBJECTS AND ADVANTAGES

Accordingly, several objects and advantages of the present invention are to provide a waveform translator for oscillography:

a) to provide a waveform translator with a DC to 75 GHz bandwidth;

b) to provide a waveform translator with multiple input channels;

c) to provide a waveform translator with microhertz frequency resolution for measuring pseudo random patterns;

d) to provide a waveform translator with sub picosecond horizontal resolution;

e) to provide a waveform translator with microvolt vertical sensitivity;

f) to provide a waveform translator with a wide dynamic range;

g) to provide a waveform translator with an integral synthesized signal source with ECL, TTL, and comb generator output signals.

Still further objects and advantages will become apparent from a consideration of the ensuing description and accompanying drawings.

REFERENCE NUMERALS 5 oscilloscope
8 computer
10 waveform translator 20 reference generator
30 source synthesizer
40 receive synthesizer
50A–50D sampler
60A–60D analog to digital converter
70A–70D digitized waveform output
80 impulse test signal output
82 ECL test signal output
84 TTL test signal output
90A–90D input signal channel input
102 FET
104 resistor
106 voltage source
108 inductor
110 step recovery diode
202 10 MHz crystal oscillator
204 single pole single throw electronic switch
206 voltage summer
208 voltage limiter
210 10 MHz band pass filter
212 divide by 5000
214 50 MHz band pass filter
216 divide by 4
218 2 KHz reference output
220 50 MHz reference output
222 50 MHz reference output
224 2.5 MHz reference output
226 2.5 MHz reference output
302 phase frequency comparator
304 loop filter
306 200–330 MHz VCO
308 power divider
310 divide by N
312 comb generator
314 800–1600 MHz band pass filter
316 amplifier
318 direct digital synthesis oscillator
320 12 MHz low pass filter
321 divide by 4
322 phase frequency comparator
324 loop filter
326 voltage summer
328 12 bit digital to analog converter
330 800–1600 MHz VCO
332 power divider
334 attenuator
336 mixer
338 40 MHz low pass filter
340 divide by 10
342 divide by 2 to the n
344 fan out buffer
346A–346E impulse generator
348 ECL output driver
350 TTL output driver
402 phase frequency comparator
404 loop filter
406 200–330 MHz VCO
408 power divider
410 divide by N
412 comb generator
414 800–1600 MHz band pass filter
416 amplifier
418 direct digital synthesis oscillator
420 12 MHz low pass filter
421 divide by 4
422 phase frequency comparator
424 loop filter
426 voltage summer
428 12 bit digital to analog converter
430 800–1600 MHz VCO
432 power divider
434 attenuator
436 mixer
438 40 MHz low pass filter
440 divide by 10
442 divide by 2 to the n
444 fan out buffer
454A–454D sampler drive signal
514A resistor
516A capacitor
518A resistor
520A diode
522A resistor
524A capacitor
526A sampler output
602A voltage summer
604A offset digital to analog converter
606A amplifier
608A 400 Hz low pass filter
610A single pole double throw electronic switch
612A 14 bit analog to digital converter
614A voltage controlled current pull down
616A digital to analog converter
618A 40 Hz low pass filter

PREFERRED EMBODIMENT—DESCRIPTION

Figure 1:
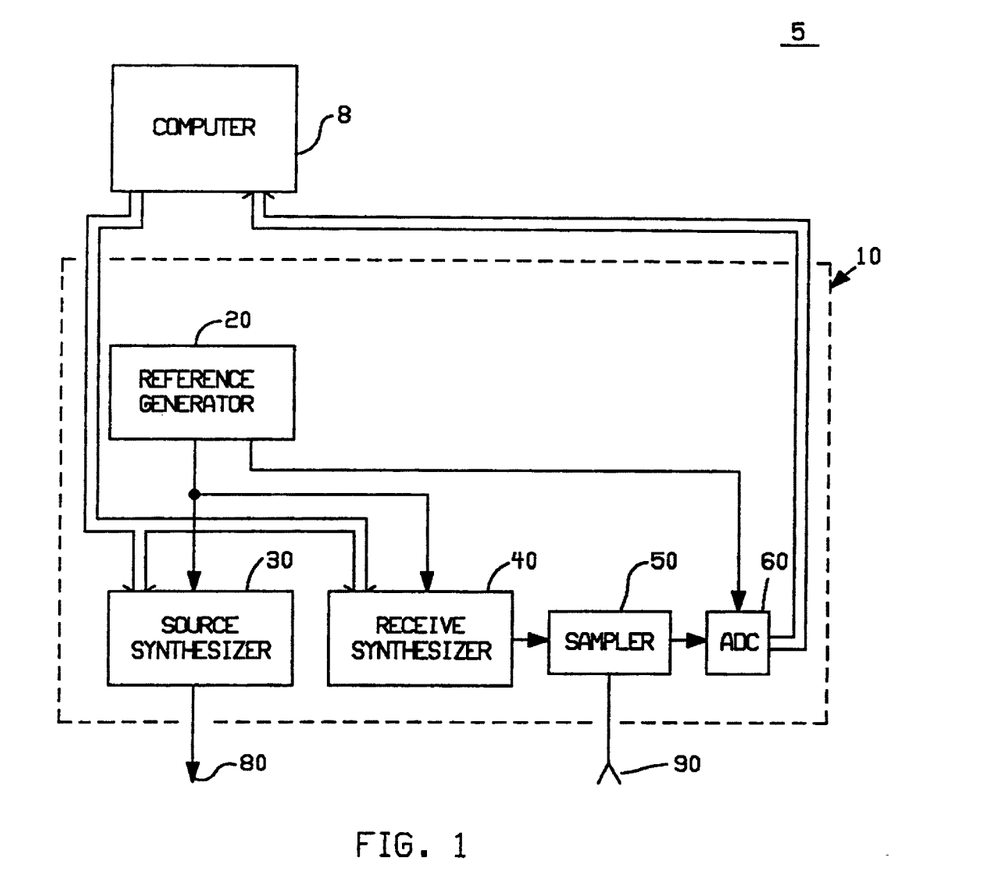
FIG. 1 is a block diagram of an oscilloscope comprising a computer and one embodiment of the waveform translator in accordance with the invention.

As shown in FIG. 1, one embodiment of the present invention provides a waveform translator generally indicated by numeral 10. The waveform translator is preferably incorporated into a test instrument for DC to 75 GHz oscillography generally indicated by numeral 5 comprising a waveform translator in accordance with the present invention, and a computer numeral 8.

As shown in FIG. 1, the waveform translator comprises a reference generator 20 to provide a reference signal for a source synthesizer 30 and a receive synthesizer 40, and to provide a clock signal for a ADC 60. The source synthesizer 30 drives an output test signal 80, the receive synthesizer 40 drives the control port on a sampler 50. Preferably, a computer 8 programs the source synthesizer and the receive synthesizer. An input signal 90 is received by the sampler 50, the samplers output signal is digitized in ADC 60. Preferably the digitized waveform is fed to the computer 8 to process the digitized waveform and display the input waveform.

Figure 2:
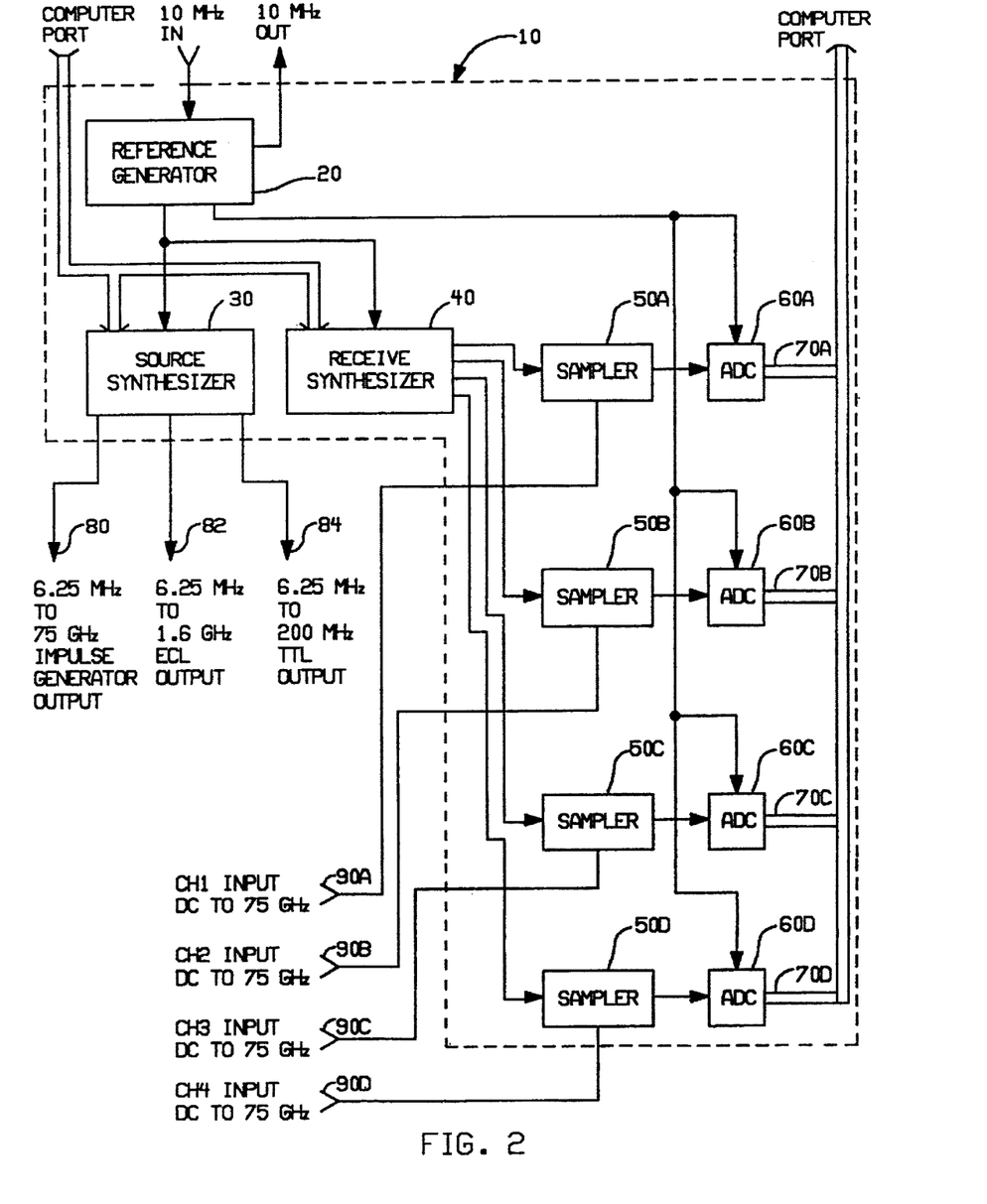
FIG. 2 is a block diagram of a preferred embodiment of the waveform translator in accordance with the invention.

As shown in FIG. 2, a preferred embodiment of the present invention provides a waveform translator 10 and comprises the following. The reference generator 20 which has rear panel connections to a 10 MHz input signal and a 10 MHz output signal, provides the reference signal for the source synthesizer 30 and the receive synthesizer 40 and also provides the clock signal for the ADCs 60A, 60B, 60C, 60D.

The source synthesizer 30 drives the impulse generator output 80, the ECL output 82 and the TTL output 84. The receive synthesizer 40 drives the control ports on the samplers 50A, 50B, 50C, 50D. Preferably, the source synthesizer and the receive synthesizer are programmed through a computer port. Input signals 90A, 90B, 90C, 90D are received by the samplers 50A, 50B, 50C, 50D. The samplers output signals are digitized in the ADCs 60A, 60B, 60C, 60D and are fed to buses 70A, 70B, 70C, 70D. Preferably, buses 70A, 70B, 70C, 70D drive a computer port.

Figure 3:
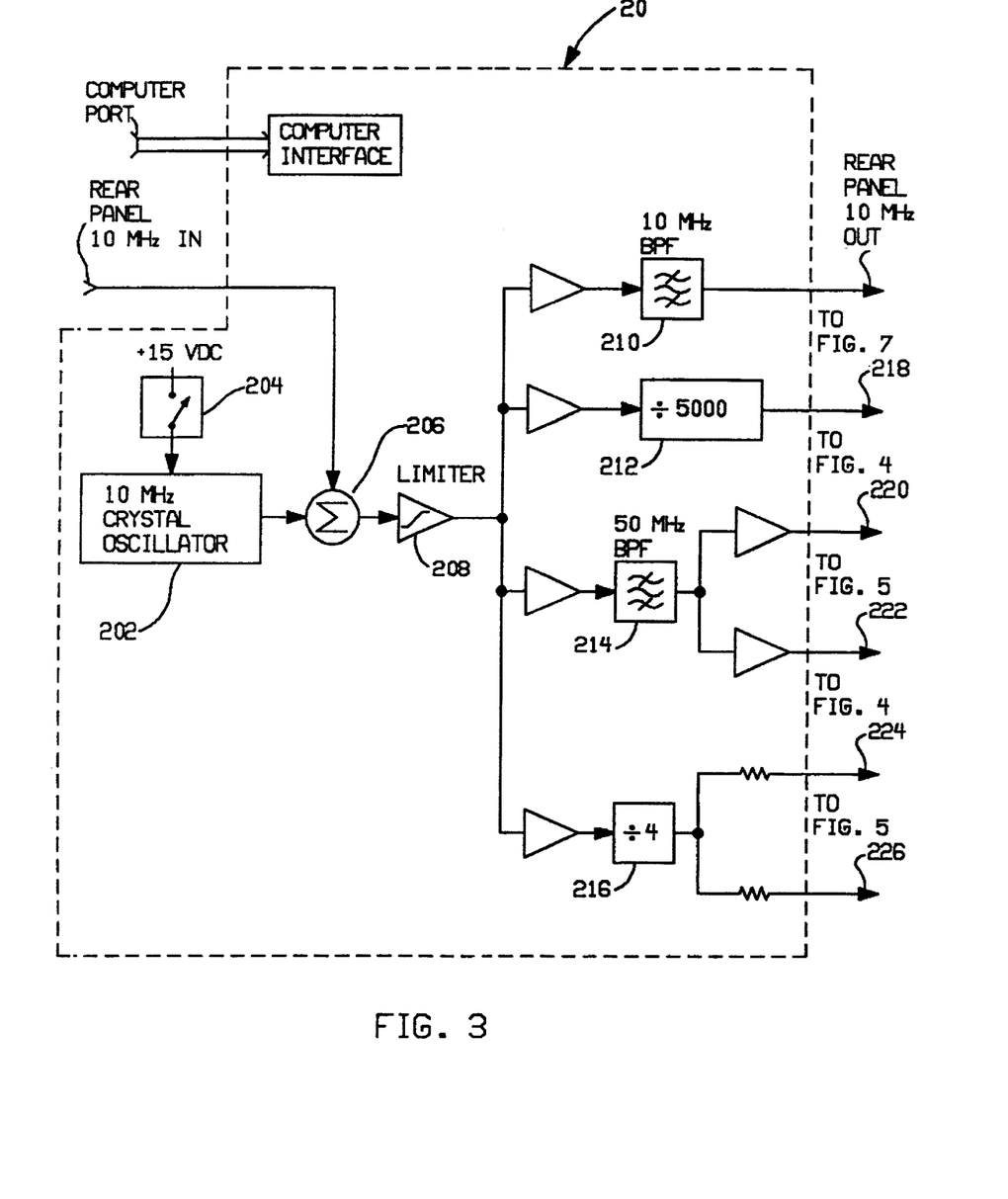
FIG. 3 through FIG. 8 is a schematic diagram of the waveform translator shown in FIG. 2.

As shown in FIG. 3, the reference generator 20 comprises a 10 MHz crystal oscillator 202 which is powered through a single pole single throw electronic switch 204. The 10 MHz crystal oscillator drives a voltage summer 206 and the voltage summer is also driven from a rear panel 10 MHz reference in. The voltage summer 206 drives voltage limiter 208 and the voltage limiter then drives a 10 MHz band pass filter 210, a divide by 5000 numeral 212, a 50 MHz band pass filter 214, and a divide by 4 numeral 216. The 10 MHz band pass filter 210 drives the rear panel 10 MHz out, the divide by 5000 numeral 212 drives 218 leading to FIG. 7. The 50 MHz band pass filter 214 is split and buffered and then drives 220 leading to FIG. 4 and 222 leading to FIG. 5. The divide by 4 numeral 216 are resistively split and drive 224 to FIG. 4 and 226 to FIG. 5. Preferably a computer interface is driven by the computer port to control the single pole single throw electronic switch 204.

Figure 4:
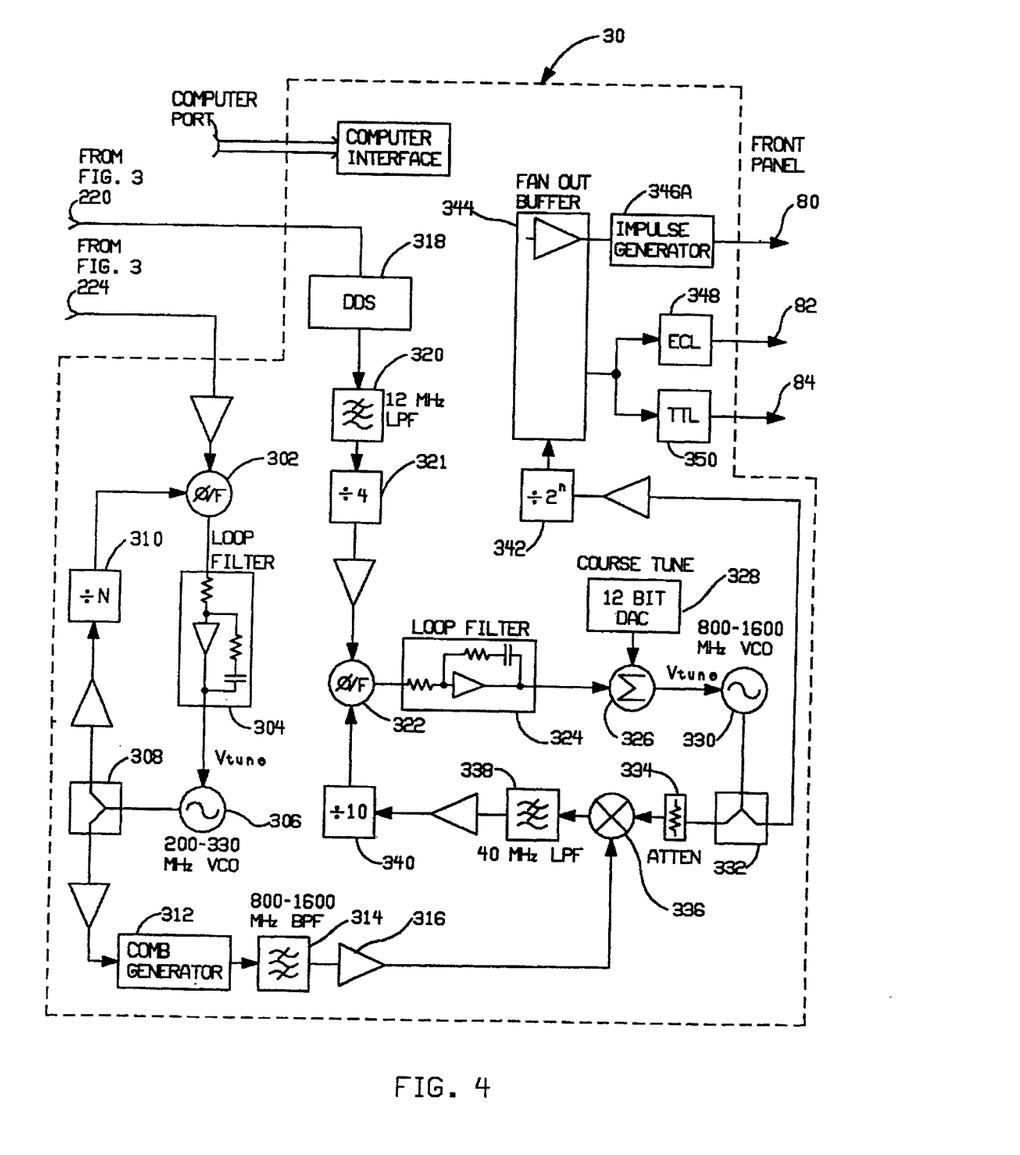

As shown in FIG. 4, the source synthesizer 30 comprises an input signal numeral 224 from FIG. 3 to drive one port of a phase frequency comparator 302. A second port of the phase frequency comparator 302 is driven by a divide by N 310, to produce a correctional signal which is input to a loop filter 304. The loop filter 304 drives the tuning voltage tune of a 200 MHz–330 MHz VCO 306. The signal from VCO 306 is split in a power divider 308. The power divider 308 drives the divide by N 310 to close the 200–330 MHz loop and also drives a comb generator 312. The comb generator 312 drives an 800–1600 MHz band pass filter 314. This signal is amplified in amplifier 316 and drives the LO port on mixer 336. The FIG. 3 220 signal clocks DDS 318. The DDS 318 is fed into a 12 MHz low pass filter 320 and then to a divide by 4 numeral 321. The divide by 4 drives one port on phase frequency comparator 322. The phase frequency comparator provides a correctional voltage to drive a loop filter 324 which drives a voltage summer 326. A 12 bit digital to analog converter 328 also drives voltage summer 326 to produce a tuning voltage Vtune for the 800–1600 MHz VCO 330. The 800–1600 MHz VCO output signal is split in power divider 332 and one side of the power divider drives an attenuator 334 and the other side of the power divider is buffered and drives a divide by 2 to the n 342. The attenuator 334 drives the RF port of the mixer 336 and the mixer produces an IF signal which is buffered to drive a divide by 10 numeral 340. The divide by 10 drives the phase frequency comparator 322 to close the 800–1600 MHz loop. The divide by 2 to the n 342 is buffered and split in a fan out buffer 344 and drives an impulse generator 346A, an ECL translator 348, and a TTL translator 350. Preferably a computer interface is driven by the computer port to control the DDS 318, the divide by N 310, the 12 bit DAC 328 and the divide by 2 to the n 342. The impulse generator 346 drives the impulse generator output 80, the ECL translator drives the ECL output 82, and the TTL translator drives the TTL output 84.

Figure 5:
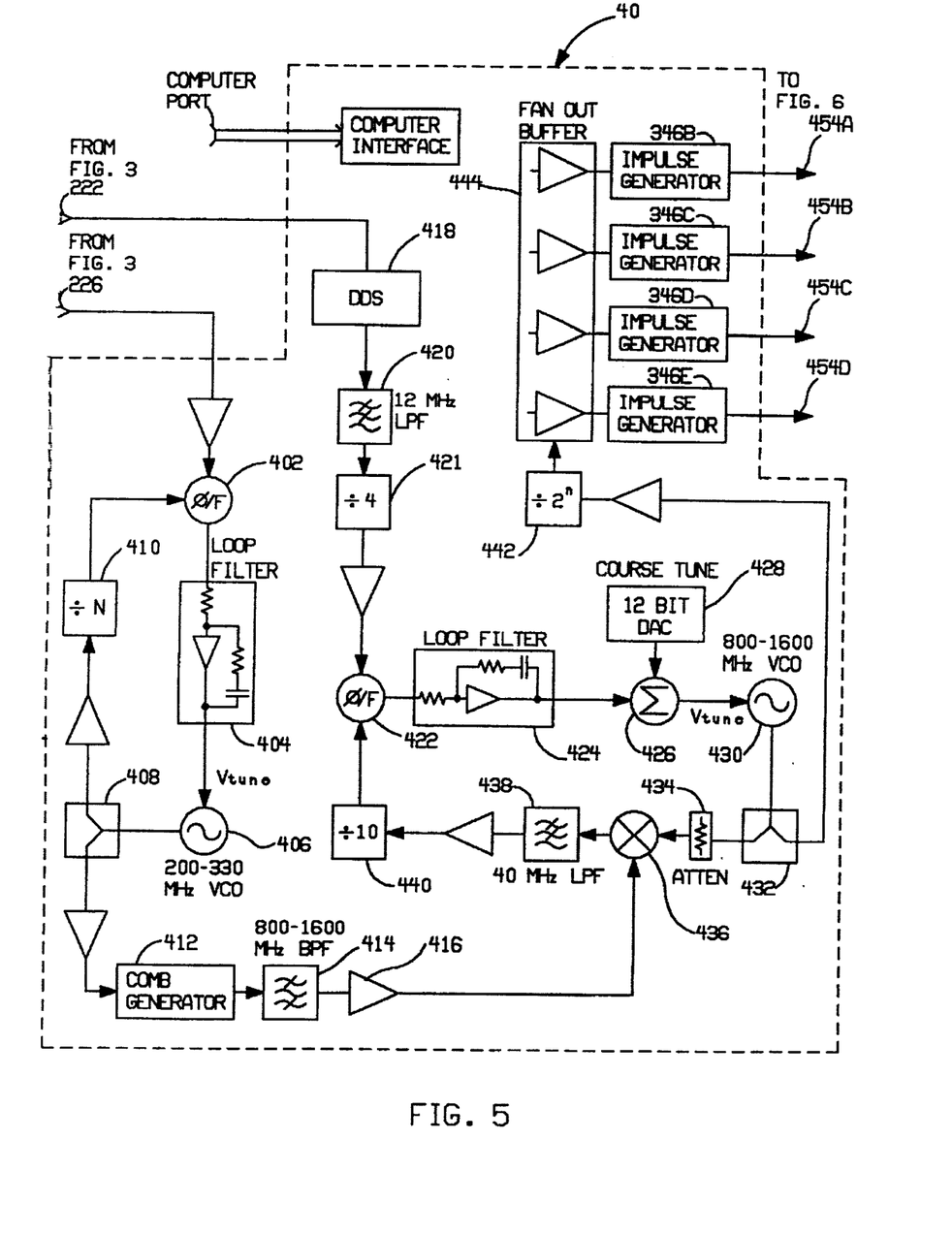

As shown in FIG. 5, the receive synthesizer 40 comprises an input signal numeral 226 from FIG. 3 to drive one port of a phase frequency comparator 402. A second port of the phase frequency comparator 402 is driven by a divide by N 410, to produce a correctional signal which is input to a loop filter 404. The loop filter 404 drives the tuning voltage Vtune of a 200 MHz–330 MHz VCO 406. The signal from VCO 406 is split in a power divider 408. The power divider 408 drives the divide by N 410 to close the 200–330 MHz loop and also drives a comb generator 412. The comb generator 412 drives an 800–1600 MHz band pass filter 414. This signal is amplified in amplifier 416 and drives the LO port on mixer 436. The FIG. 3 222 signal clocks DDS 418. The DDS 418 is fed into a 12 MHz low pass filter 420 and then to a divide by 4 numeral 421. The divide by 4 drives one port on phase frequency comparator 422. The phase frequency comparator provides a correctional voltage to drive a loop filter 424 which drives a voltage summer 426. A 12 bit digital to analog converter 428 also drives voltage summer 426 to produce a tuning voltage Vtune for the 800–1600 MHz VCO 430. The 800–1600 MHz VCO output signal is split in power divider 432 and one side of the power divider drives an attenuator 434 and the other side of the power divider is buffered and drives a divide by 2 to the n 442. The attenuator 434 drives the RF port of the mixer 436 and the mixer produces an IF signal which is buffered to drive a divide by 10 numeral 440. The divide by 10 drives the phase frequency comparator 422 to close the 800–1600 MHz loop. The divide by 2 to the n is buffered and split in a fan out buffer 444 and drives impulse generators 346B, 346C, 346D, and 346E. Preferably a computer interface is driven by the computer port to control the DDS 418, the divide by N 410, the 12 bit DAC 428 and the divide by 2 to the n 442. The impulse generator 346B drives signal 454A to FIG. 6, the impulse generator 346C drives signal 454B, the impulse generator 346D drives signal 454C, the impulse generator 346E drives signal 454D.

Because the samplers 50A, 50B, 50C, and 50D are identical only sampler 50A will be described in detail.

Figure 6:
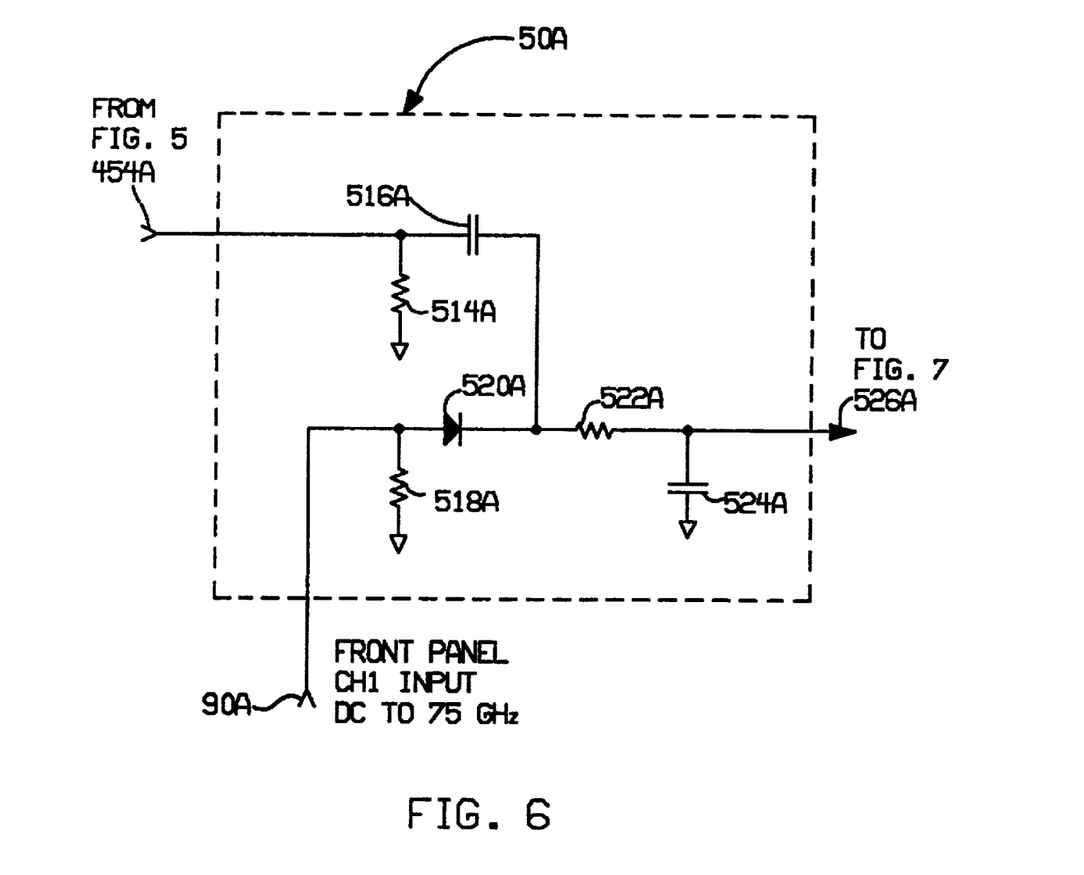

As shown in FIG. 6, the sampler 50A comprises the sampler drive signal numeral 454A from FIG. 5 which drives a resistor termination 514A, and a coupling capacitor 516A. The coupling capacitor 516A drives a diode 520A's cathode. The input signal 90A drives a termination resistor 518A and the diode 520A's anode. The diode 520A drives a resistor 522A which drives a capacitor 524A and provides signal 526A to FIG. 7.

Because the ADCs 60A, 60B, 60C, and 60D are identical only ADC 60A will be described in detail.

Figure 7:
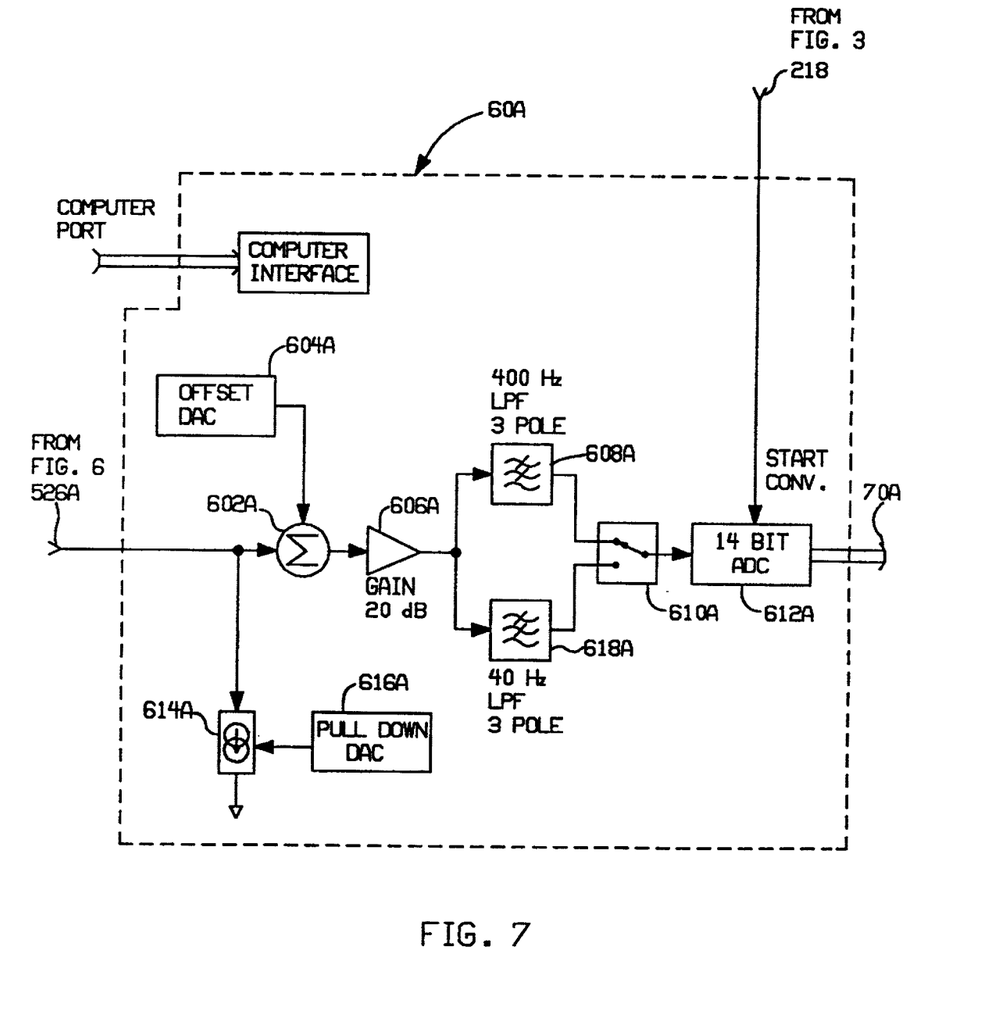

As shown in FIG. 7, the ADC 60A comprises the sampler output signal numeral 526A from FIG. 6 which drives a voltage summer 602A and a programmable current pull down 614A. A digital to analog converter 616A drives the current pull down 614A. A digital to analog converter 604A provides an offset voltage to the voltage summer 602A which drives an amplifier 606A. The amplifier drives a 400 Hz low pass filter 608A and a 40 Hz low pass filter 618A. The 400 Hz low pass and the 40 Hz low pass are selected in a single pole double throw electronic switch 610A. The switch drives a 14 bit analog to digital converter 612A. The clock signal 218 from FIG. 3 provides a start conversion signal to the ADC 612A. ADC 612A drives the bus 70A. Preferably a computer interface is driven by the computer port to control the offset DAC 604A, the pull down DAC 616A and the single pole double throw electronic switch 610A.

Figure 8:
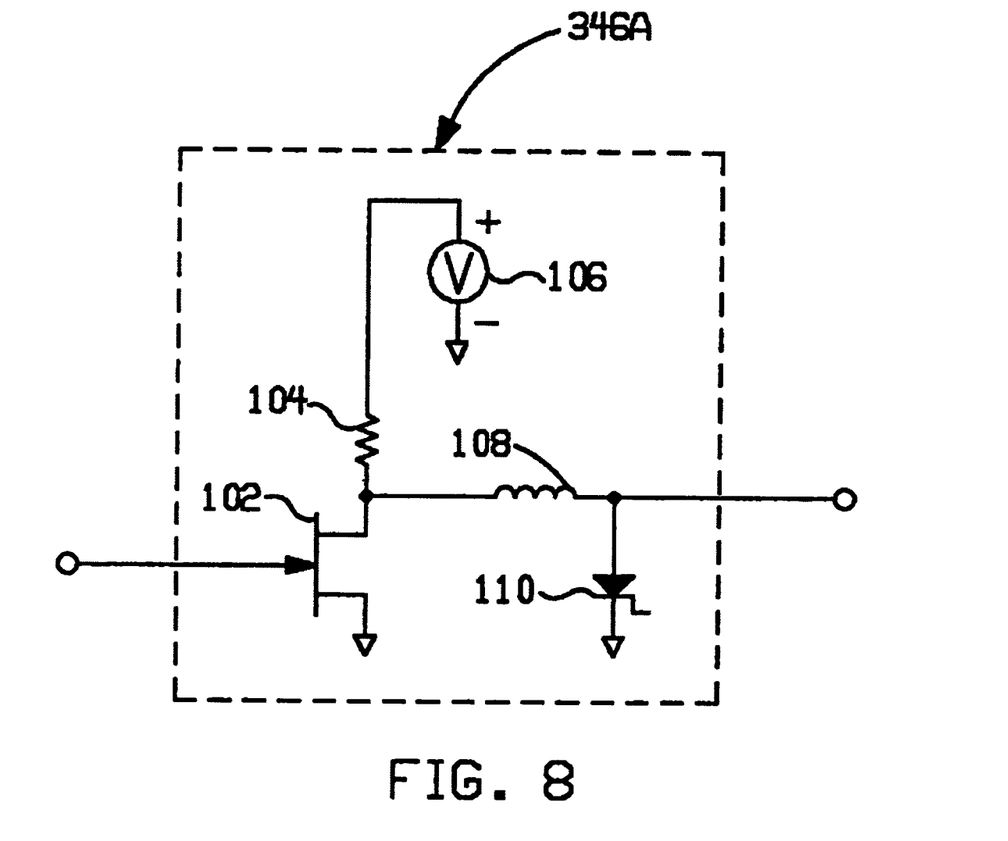

The Impulse generators 346A, 346B, 346C, 346D and 346E are identical and are shown in detail in FIG. 8. As shown in FIG. 8, a drive signal is received on FET 102's gate. Resistor 104 is connected to a voltage source 106 and provides bias for the drain on FET 102. An inductor 108 is driven from the drain of the FET which drives a step recovery diode 110 and outputs an impulse signal.

From the description above, a number of advantages of the waveform translator become evident:
  a) The horizontal timing is based on the difference frequency between two synthesized sources in relation to a common fixed frequency reference. This obviates the need for a horizontal sweep circuit and a trigger circuit, which are limited in bandwidth and introduce timing uncertainties. In addition, an exact integer number of samples can be taken for each cycle of the input signal which improves the accuracy of subsequent FFT analysis.

b) The source and receive synthesizers incorporate multiple feedback loops to meet both low phase noise and frequency resolution requirements. Low phase noise is essential for frequency coverage to 75 GHz. Frequency resolution in the microhertz is essential to accurately display millimeter wave frequency pseudo random patterns.

c) The start conversion clock for the ADCs is separate from the sampler drive signals. The start conversion clock is 2 KHz and works with a high resolution analog to digital converter to allow a wide vertical dynamic range. In addition, the sampler drive frequency can be as high as 1.6 GHz which allows accurate microwave and the millimeter wave sampling of the input signal.

d) The impulse generator circuit is physically close to the sampler circuit and is dedicated to one sampler. The interconnections and loading are minimized so that the harmonic content of the impulse generator is maintained.

e) The sampler circuit is of a new type comprised of a single diode. This circuit obviates the need for a balun which is a band limiting structure. It requires a lower sampler drive signal than a two or four diode circuit and has the parasitic capacitance of only one diode.

Preferred Embodiment—Operation

The waveform translator is preferably combined with a computer to measure the time domain and the frequency domain response of a device under test. In the time domain, measurements such as voltage swing, DC level, rise time, fall time, overshoot, undershoot, pulse width, pulse distortion, propagation delay, eye diagrams of pseudo random patterns, time domain reflectometry and many others are performed. In the frequency domain, measurements such as transmission both amplitude and phase, and reflection both amplitude and phase, group delay and many others are performed.

The reference generator 20 as shown in FIG. 3, contains a low phase noise 10 MHz crystal oscillator 202. The external reference input allows the waveform translator to lock onto an external phase lock or synthesized oscillator. The internal reference output allows an external phase lock or synthesized oscillator to lock onto the waveform translator. The crystal oscillator is powered through the programmable electronic switch 204. When an external reference is used the internal crystal oscillator is powered down to eliminate any possibility of leakage. The 50 MHz signals 220 and 222 are obtained by filtering the fifth harmonic from the limiter 208. The frequency divider 216 is resistively split to produce two 2.5 MHz signals 224, 226 and is shared between the source synthesizer 30 and the receive synthesizer 40. The phase noise of signals 224 and 226 are correlated thus largely eliminating the phase noise contribution of the frequency divider 216. The reference generator outputs a 2 KHz signal produced in the divide by 5000 numeral 212 to be used as the start conversion signal in the ADCs.

As shown in FIG. 4, the source synthesizer 30 includes, a 200 to 330 MHz course tune loop comprising 302 to 316, the direct digital synthesis section comprising 318 to 321, an 800 to 1600 MHz loop comprising 322 to 340, and an output section comprising 342 to 350.

The 200 to 330 MHz loop is designed to minimize phase noise, and to minimize spurious signals. The step size of the loop is 2.5 MHz based on the reference signal 224. The output frequency of the loop is N*2.5 MHz where N is an integer between 83 and 123 and is set in the divide by N 310. The 200 to 330 MHz loop drives a comb generator 312 and is multiplied up. An 800 to 1600 MHz band pass filter 314 filters the comb output. The 800 to 1600 MHz band pass filter suppresses spurious mixing products in the 800 to 1600 MHz loop which if not suppressed show up as beats in the digitized waveform. The output of the filter drives a buffer amplifier 316 which drives the LO port of the mixer 336.

Referring to the direct digital synthesis oscillator DDS 318, the oscillator is clocked at 50 MHz from the reference generators output 220. The DDS is low pass filtered in the 12 MHz low pass filter 320 and then divided by 4 in the frequency divider 321. The output of the divide by 4 numeral 321, is the reference signal for the 800 to 1600 MHz loop. The step size of the 800 to 1600 MHz loop is in the microhertz range.

The multiplication factor of the DDS is fixed at 2.5 and the phase noise does not increase with increased resolution. Therefore, the 800 to 1600 MHz loop can have an arbitrarily small step size and still maintain low phase noise. A novel, unobvious, and previously unexpected result of incorporating a DDS is that the absolute phase of the source synthesizer 30 can be maintained even after changing frequencies. This result allowed the displayed waveform to stay fixed in relation to the horizontal axis independent of changing to a new base rate.

Referring to the 800 to 1600 MHz loop, the 800 to 1600 MHz VCO 330 is course tuned with a 12 bit digital to analog converter 328. The course tune voltage is summed with the loop correctional voltage in the voltage summer 326. The oscillator signal is split in a power divider 332. One output of the power divider feeds back into the loop and drives an attenuator 334. By reducing the RF signal level into the mixer 336 the mixer is made to operate in a linear region. The mixers IF port drives a 40 MHz low pass filter 338. The IF signal is between 20 and 35 MHz. The filtered IF signal is buffered and drives the divide by ten 340 to produce a 2 to 3.5 MHz IF signal. The 2 to 3.5 MHz IF signal is compared with the direct digital synthesis oscillator in the phase frequency comparator 322. The loop filter 324 follows and a correctional voltage is fed to the voltage summer 326 to lock the 800 to 1600 MHz loop.

Referring to the source synthesizers output section, the power divider 332 drives a programmable prescaler 342. The prescaler divides by 2 to the n where n equals 0 to 7 and generates the final fundamental output frequency of the synthesizer between 6.25 MHz to 1600 MHz. The prescaler drives a fan out buffer 344 to produce three output signals. The ECL block 348 is an ECL buffer to provide an ECL test signal from 6.25 MHz to 1600 MHz. The TTL block 350 is an ECL to TTL translator to provide a TTL output test signal from 6.25 MHz to 200 MHz. The Impulse generator 346A produces a harmonic test signal from 6.25 MHz to 75 GHz and will be described in detail later.

The source synthesizer 30 is tuned to a desired frequency as follows. An appropriate harmonic number is calculated for the 200 to 330 MHz loop; either 4, 5, or 6. If the harmonic number equals 6 then the 200 to 330 MHz loop will be within 15 MHz of the desired output frequency. A course tune voltage 328 is supplied to the 800 to 1600 MHz VCO 330 tuning the oscillator to within 10 MHz of the desired output frequency. The 800 to 1600 MHz VCO 330 is down converted in the mixer 336 to a 20 to 35 MHz IF range. The divide by N 310 is calculated such that the IF frequency is as close as possible to 20 MHz but no less than 20 MHz. The direct digital synthesis oscillator 318 is made equal to the IF frequency divided by 2.5. As an example let the desired output frequency equal 1.6 GHz. Then the harmonic number is 6. The 200 to 330 MHz loop is tuned to 270 MHz. The IF is 20 MHz and the direct digital synthesis oscillator is set to 8 MHz.

As shown in FIG. 5, the receive synthesizer 40 is identical to the source synthesizer 30 up to the fan out buffer 444.

Referring to the fan out buffer 444, each output of the fan out buffer consumes only 180 milliwatts and one buffer is supplied per measurement channel. Adding measurement channels is very efficient in terms of power consumption. As an example, the buffers for 16 measurement channels consumes less than 3 watts. Each buffer drives an impulse generator 346B, 346C, 346D, 346E.

As shown in FIG. 8, the impulse generator 346A comprises a FET 102, a resistor 104, a power supply 106, an inductor 108 and a step recovery diode 110. The total power consumption of the impulse generator is approximately 300 milliwatts and the circuit requires a single 3.2 volt power supply. The novelty of this impulse generator circuit produced many new, unobvious, and previously unexpected results. Because of its low power consumption, one impulse generator is provided for each measurement channel. This eliminates the interconnect associated with sharing one impulse generator with multiple channels and in addition reduces the loading on the impulse generator. The result is to maintain the impulse generators harmonic content. Furthermore, the impulse generator outputs a pulse amplitude which is ideal for the sampler circuit. In addition, the 3.2 volt bias can be supplied by a lithium cell battery and therefore the circuit lends itself to battery powered operation which is essential for portability.

The impulse generators operation is as follows. Initially the FET 102 is rendered non conducting and the voltage source 106 flows current through the resistor 104, and the inductor 108, to the step recovery diode 110. The diode has a highly non linear capacitance voltage relationship and under forward bias a substantial amount of charge is stored. When the FET receives a signal from the fan out buffer it conducts and shunts the current supplied by resistor 104 and additionally reverses the current flow through inductor 108. As charge is removed from the diode the forward voltage reduces and the diode moves toward a low capacitance region. At zero stored charge and zero voltage drop the diode is ideally in a minimum capacitance region and the diode reverse voltage will change very rapidly with continued current flow in the inductor 108. Including the load resistor 514A shown in FIG. 6 the voltage waveform can be analyzed as a resonant parallel RLC network. However, as soon as the diode voltage starts to go positive all charge will be stored in the diode and the result is a single negative going impulse.

The impulse generator 346B drives sampler 50A. As shown in FIG. 6, sampler 50A is a single diode sampler. The novelty of this sampler produced many new, unobvious, and previously unexpected results. The sampler does not require a balun and therefore the impulse drive signal terminates in an ultra broadband load 514A permitting operation to at least 75 GHz. CH1 input 90A terminates in an ultra broadband load 518A with a small additional capacitance of approximately 40 femtofarads associated with the sampling diode 520A.

The samplers operation is as follows. The hold capacitor 516A is charged by way of the diode 520A and discharges by way of the resistor 522A. If a 1 microamp constant current depletes the charge on the hold capacitor 516A and the receive synthesizer 40 is programmed to 1.6 GHz then the charge removed per cycle is 6.26e-16 coulombs. In equilibrium, the diode must resupply the charge. If the diode is in conduction for 2 psec, the forward current will be 312 micro amps and a specific forward voltage drop is generated across the diode. The voltage of the impulse generator drive signal plus the voltage on the hold capacitor plus the forward voltage drop of the sampling diode equals the CH1 input voltage 90A. The receive synthesizer 40 repetition rate is programmed so that the Ch1 input signal 90A is tremendously over sampled and from sample to sample the voltage at 90A appears virtually constant. The samplers output frequency response is perfectly flat and does not require any correction. As the convolution progresses a waveform is produced at 526A that represents the waveform at 90A.

The single diode sampler has the largest bandwidth of any sampler. On the other hand, linearity can be a problem in this sampler and there exists a frequency versus input power relationship governing the effect. Increasing the fixed pull down current FIG. 7 614A, largely eliminates the linearity problem. However, at low repetition rates the diode 520A forward current is too large to resupply the hold capacitor 516A. The solution is to modulate the fixed current pull down 614A with the digital to analog converter 616A dependent on the receive synthesizer 40 repetition rate. This novel and unobvious circuit results in a single diode sampler with improved linearity independent of the receive repetition rate.

Referring to FIG. 7, the voltage summer 602A subtracts the DC offset from the signal 526A. The offset digital to analog converter 604A adjusts for varying DC offset of the signal 526A as a function of the receive synthesizer 40 repetition rate. The voltage summer 602A drives amplifier 606A and provides an optimum level for the digital to analog converter 612A independent of the receive synthesizer's 40 repetition rate. Amplifier 606A drives two low pass filters, 608A and 618A. Filters 608A a 400 Hz low pass filter and 618A a 40 Hz low pass filter comprise a dual bandwidth noise reduction filter network. The desired filter is switched in a single pole double throw switch 610A. Switch 610A provides the input signal to the 14 bit analog to digital converter 612A. The analog to digital converter 612A preferably drives a computer connected to bus 70A to display the digitized waveform.

The frequency relationship between the input signal 90A and the receive synthesizer 40 follows. The receive frequency synthesizer is determined by the following relationship.

$$F \text{ receive} = F \text{ input signal}/P + F \text{ reference}/(M*N)$$

F input signal=the input signals repetition rate
F reference=10 MHz
M=5000
N=number of evenly spaced points for each cycle of the input signal
P is calculated according to the following rules:
    For input repetition rates<=1600 MHz
        P=1
    For input repetition rates such that F input signal/1600 MHz is an integer
        P=F input signal/1600 MHz
    For all other input repetition rates
        P=1+F input signal/1600 MHz As an example if the input signals repetition rate is 40 GHz and the number of points is 2048 then, P=25 and F receive=1.6 GHz+0.9765625 Hz.

The results of this novel and unbvious equation are to maximize the sampler drive frequency for accurate microwave and millimeter wave sampling of the input signal;

to provide an exact integer number of samples for each cycle of the input signal which improves the accuracy of subsequent FFT analysis;

to produce a sampler output frequency response which is perfectly flat;

to produce data points at a rate suitable for high resolution analog to digital conversion;

to produce data points at a rate which can be read directly into a display device.

Conclusions, Ramifications, and Scope

Accordingly, the reader will see that the waveform translator invention can perform measurements heretofore not possible with prior art test equipment. The DC to 75 GHz bandwidth is broader than any sampling oscilloscope currently available. The 14 bit analog to digital converter provides over 80 dB dynamic range, and the source output has the smallest step size of any commercially available microwave source. Furthermore, this invention has the additional advantages in that it provides a waveform translator with a single diode sampler resulting in a DC to 75 GHz input bandwidth;

it provides a waveform translator with multiple input channels; each input channel incorporates one impulse generator with each sampler, thus avoiding any degradation in the DC to 75 GHz input bandwidth;

it provides a waveform translator with a receive synthesizer incorporating a DDS oscillator, allowing it to have microhertz frequency resolution for measuring pseudo random patterns and resulting in continuous phase when changing frequency;

it provides a waveform translator with a receive synthesizer to produce a sampler drive frequency as high as 1.6 GHz which allows accurate microwave and millimeter wave sampling of the input signal;

it provides a waveform translator with a source and a receive synthesizer wherein both are multiple loop synthesizers resulting in low phase noise, and DC to 75 GHz frequency response, and 1 picosecond horizontal timing;

it provides a waveform translator with a reference clock to start the conversion of a 14 bit analog to digital converter resulting in a vertical input channel with microvolt sensitivity, a wide dynamic range, and an exact integer number of data points evenly spaced across the input signal;

it provides a waveform translator with an ECL, a TTL and an impulse test signal source output capability thereby providing a complete measurement solution.

While the above description contains many specifics, these should not be construed as limitations on the scope of the invention, but as examples of the presently-preferred embodiments thereof. Many other ramifications and variations are possible within the teachings of the invention. For example, the 14 bit analog to digital converter can be replaced with a higher resolution converter, the 10 MHz reference frequency could be 5 MHz, the FET in the impulse generator could be a bipolar transistor, a balanced sampler can replace the single diode sampler for reduced bandwidth applications, the start conversion signal can increase in frequency to meet improved analog to digital converter technology, the synthesizers can be non tunable fixed frequency synthesizers, frequency control can be provided with manual switches. The repetitive test input signal can be observed on any display device capable of accepting the digitized output waveform.

Thus the scope of the invention should be determined by the appended claims and their legal equivalents, and not by the examples given.

Summary

A system for generating a repetitive test output signal and measuring a repetitive test input signal, comprises a reference generator for producing a plurality of reference signals harmonically related to a specific reference frequency, a plurality of synthesizers responsive to the plurality of reference signals with means to generate and output a plurality of harmonically related signals at a source repetition rate and output a plurality of harmonically related signals at a receive repetition rate, a sampler responsive to each of the plurality of harmonically related signals at the receive repetition rate, and responsive to each frequency component of the repetitive test input signal to output a plurality of harmonically related difference signals, and an analog to digital conversion means responsive to one of the reference signals to digitize the plurality of harmonically related difference signals and to output a digitized waveform corresponding to the repetitive test input signal.

What is claimed is:

1. A system for generating a repetitive test output signal and measuring a repetitive test input signal, comprising:

a) a reference generator for producing a plurality of reference signals harmonically related to a specific reference frequency;

b) a plurality of synthesizers with means responsive to said plurality of reference signals to generate and output a plurality of harmonically interrelated signals at a source repetition rate, and with means responsive to said plurality of reference signals and to said repetitive test input signal to output a plurality of harmonically interrelated signals at a receive repetition rate such that the receive repetition rate is set by calculating a first quotient by dividing the frequency of said repetitive test input signal by a value set according to a predetermined frequency, calculating a second quotient by dividing said specific reference frequency by a predetermined integer, and adding said first quotient and said second quotient;

c) a sampler responsive to each of said plurality of harmonically interrelated signals at the receive repetition rate, and responsive to a plurality of frequency components of said repetitive test input signal to output a plurality of harmonically interrelated difference signals;

d) an analog to digital conversion means responsive to one of said reference signals to digitize said plurality of harmonically interrelated difference signals and to output a digitized waveform corresponding to said repetitive test input signal.

2. The system of claim 1, wherein said plurality of synthesizers are direct digital synthesis synthesized sources.

3. The system of claim 1, wherein said means responsive to said plurality of reference signals and to said repetitive test input signal to output a plurality of harmonically related signals at the receive repetition rate is produced in a circuit comprising a step recovery diode and a transistor.

4. The system of claim 1, wherein said sampler comprises a single diode circuit.

5. The system of claim 1, further comprising a circuit means to improve the linearity of said sampler independent of said receive repetition rate.

6. The system of claim 1, further comprising a programmable DC offset and fixed amplification means to provide an optimum level for said analog to digital conversion means, independent of said receive repetition rate.

7. The system of claim 1, further comprising a dual bandwidth noise reduction filter for reducing noise in said digitized waveform.

8. The system of claim 1, further comprising a circuit connected to one of said plurality of synthesizers to output an ECL test signal.

9. The system of claim 1, further comprising a circuit connected to one of said plurality of synthesizers to output a TTL test signal.

10. The system of claim 1, wherein said receive repetition rate is determined by the relationship:

$$F \text{ receive} = F \text{ input signal}/P + F \text{ reference}/(M*N)$$

whereby F receive is the receive repetition rate, F input signal is the frequency of said repetitive test input signal, P is a positive integer greater than zero, F reference is the specific reference frequency, M is a positive integer greater than zero, and N is a predetermined number of evenly spaced points for each cycle of said repetitive test input signal.

11. The system of claim 1, further comprising a computer for displaying said digitized waveform in a voltage versus time format.

12. The system of claim 1, further comprising a computer to transform said digitized waveform to a frequency domain format.

13. The system of claim 1, further comprising a computer to control the frequency of said plurality of synthesizers.

14. A method for measuring a pseudo random pattern input signal having a known base repetition rate, comprising the steps of:

a) providing a plurality of harmonically interrelated signals at a receive repetition rate;

b) setting the receive repetition rate by calculating a first quotient by dividing the repetition rate of said pseudo random pattern input signal by a value derived from a first predetermined frequency, calculating a second quotient by dividing a second predetermined frequency by a predetermined integer, and adding said first quotient and said second quotient;

c) sampling the pseudo random pattern input signal according to said pluralty of harmonically interrelated signals at said receive repetition rate to produce a plurality of harmonically interrelated difference signals;

d) digitizing the plurality of harmonically interrelated difference signals to output a digitized waveform corresponding to the pseudo random pattern input signal.

* * * * *

UNITED STATES PATENT AND TRADEMARK OFFICE
CERTIFICATE OF CORRECTION

PATENT NO. : 6,242,899 B1
DATED : June 5, 2001
INVENTOR(S) : Robert Miller

It is certified that error appears in the above-identified patent and that said Letters Patent is hereby corrected as shown below:

Claim 14,
Line 14, (column 16, line 23), change "pluralty" to -- plurality --.

Signed and Sealed this

Thirtieth Day of October, 2001

Attest:

NICHOLAS P. GODICI
Attesting Officer
Acting Director of the United States Patent and Trademark Office